United States Patent [19]

Komeda

[11] Patent Number: 4,493,740
[45] Date of Patent: Jan. 15, 1985

[54] METHOD FOR FORMATION OF ISOLATION OXIDE REGIONS IN SEMICONDUCTOR SUBSTRATES

[75] Inventor: Tadao Komeda, Ikoma, Japan

[73] Assignee: Matsushita Electric Industrial Company, Limited, Japan

[21] Appl. No.: 384,030

[22] Filed: Jun. 1, 1982

[30] Foreign Application Priority Data

Jun. 1, 1981 [JP] Japan ................................. 56-84693
Apr. 8, 1982 [JP] Japan ................................. 57-58833

[51] Int. Cl.³ .................. H01L 21/265; H01L 21/76
[52] U.S. Cl. .................................. 148/187; 148/188; 29/576 W; 29/580
[58] Field of Search ............. 148/187, 1.5, 188, 175; 29/576 W, 580; 156/657

[56] References Cited

U.S. PATENT DOCUMENTS

| | | | |
|---|---|---|---|
| 2,930,722 | 3/1960 | Ligenza | 148/1.5 X |
| 3,892,608 | 7/1975 | Kuhn | 148/188 |
| 3,961,999 | 6/1976 | Antipov | 148/175 |
| 4,157,268 | 6/1979 | Bergeron et al. | 148/187 X |
| 4,222,792 | 9/1980 | Lever et al. | 148/1.5 |
| 4,233,091 | 11/1980 | Kawabe | 148/175 |
| 4,238,278 | 12/1980 | Antipov | 156/657 |
| 4,255,207 | 3/1981 | Nicolay et al. | 29/578 X |
| 4,269,636 | 5/1981 | Rivoli et al. | 148/175 |
| 4,292,091 | 9/1981 | Togei | 29/576 W |
| 4,307,180 | 12/1981 | Pogge | 156/657 X |
| 4,356,211 | 10/1982 | Riseman | 29/576 B |
| 4,369,565 | 1/1983 | Muramatsu | 148/175 X |

*Primary Examiner*—G. Ozaki
*Attorney, Agent, or Firm*—Lowe, King, Price & Becker

[57] ABSTRACT

A method for manufacturing a semiconductor integrated circuit which comprises providing a semiconductor substrate, forming a recess in the substrate through a pattern of an oxidation-inhibiting film, forming a thin film of a material capable of being oxidizing into an insulating oxide such as silicon on the side and/or bottom surface of the recess, and oxidizing the thin film to fill up with the recess with the resulting oxide which increases in volume.

18 Claims, 22 Drawing Figures

METHOD FOR FORMATION OF ISOLATION OXIDE REGIONS IN SEMICONDUCTOR SUBSTRATES

BACKGROUND OF THE INVENTION

1. Field of the Invention

This invention relates to a method for manufacturing semiconductor integrated circuits and more particularly, to a method for isolating elements of a semiconductor integrated circuit from each other.

2. Description of the Prior Art

In the manufacture of metal-oxide-semiconductor large scale integrated (MOSLSI) circuits, the dielectric isolation between the elements of such circuit without producing any so-called bird beaks is typically effected by the procedure particularly shown in FIGS. 1(a) through 1(d). That is, on a p-type substrate 1 are formed, for example, a 0.05 micron thick $SiO_2$ film 2 and a 0.1 micron thick $Si_3N_4$ film 3. Then, the $Si_3N_4$ film 3 and $SiO_2$ film 2 on the isolation region are etched through a photoresist film 4 by the photo-etching technique, followed by anisotropically etching the Si substrate 1 to form a groove 5 with a depth of about 0.5 microns. The ion injection such as of boron for channel stopper is carried out to form an ion-injected region 6 at the bottom of the groove 5 (FIG. 1(a)).

The photoresist film 4 is then removed, after which an about 0.02 micron thick $SiO_2$ film 7 is formed on the exposed surface of the groove 5 by the thermal oxidation method, on which is further formed a 0.1 micron thick $Si_3N_4$ film by the CVD method. This $Si_3N_4$ film 8 is then etched by a sputter-etching or ion-etching technique so that the film 8 remains only at opposite sides of the groove 5 (FIG. 1(b)).

Upon oxidation in pressurized steam of 6–10 $kg/m^2$, the oxidation proceeds only from the bottom of the groove 5 to form a 1 micron thick isolation $SiO_2$ film 9 in the groove 5. At the same time, the boron in the ion-injected region 6 serves as the diffusion source and a $p^+$-type channel stopper region 11 is formed as shown in FIG. 1(c). The oxidation is continued until the $SiO_2$ film 9 grows to such a level of about the surface of the substrate 1. In this connection, because of the formation of the $Si_3N_4$ film 9 along the sides of the groove 5, the oxidation does not proceed towards the sides of the groove. As a consequence, the $SiO_2$ isolation film 9 becomes thinner in portions brought into contact with the $Si_3N_4$ film to form a gap 10. The formation of this gap causes the problem of worsening the yield of the resulting fine pattern.

When the substrate on which the $Si_3N_4$ film 3 is formed is subjected to the oxidation over a long period in order to form the $SiO_2$ film 9, a thin $Si_3N_4$ film 15 will undesirably be formed in some portions of the Si substrate beneath the $SiO_2$.

In this condition, the $Si_3N_4$ film 3 and the $SiO_2$ film 2 are removed and a gate oxide film 16, a polycrystalline Si gate electrode 12 and $n^+$ source-drain regions 13, 14 are formed. In this step, the gate oxide film 16 is not formed on the $Si_3N_4$ film regions 15 which have been partly formed on the substrate 1 upon formation of the $SiO_2$ film 9 (FIG. 1(d)). By this, the occurrence of pinholes in the gate oxide film 16 increases, causing the rate of short-circuit between the polycrystalline electrode 12 and the Si substrate 1 to increase with a decrease in yield of the LSI circuit.

The LSI circuit obtained by these steps has several drawbacks. That is, when the $SiO_2$ film 9 is formed, only part of the Si substrate exposed at the bottom of the groove 5 contributes to the formation of the $SiO_2$ film or is consumed. When oxidized, Si is converted into $SiO_2$ with a thickness of about two times as large as the consumed Si, so that the groove 5 is filled with the growing $SiO_2$ film 9. Because of the high degree of conversion, the strains established between the $SiO_2$ film 9 and the Si substrate 1 become great, causing crystal defects around the $SiO_2$ film 9 to occur with the attendant leakage current between the substrate 1 and the drain-source regions 13, 14. This leads to a lowering in yield of the LSI circuit. Another drawback is that the contact of the $p^+$-type channel stopper region 11 with the $n^+$-type drain region 14 will lower the reverse voltage and increase the p-n junction capacitance between the substrate and the drain region.

SUMMARY OF THE INVENTION

An object of the invention is to provide a method for manufacturing an integrated circuit which has a narrow isolation region or regions serving to isolate elements from one another and in which the surface of the isolation region is substantially at the same level as the surface of a semiconductor substrate.

Another object of the invention is to provide a method for manufacturing a semiconductor integrated circuit which is substantially free of any crystal defects in the semiconductor substrate after formation of the isolation region.

A further object of the invention is to provide a method for manufacturing a semiconductor integrated circuit in which a channel stopper region of high impurity concentrations is formed mainly in the bottom of the isolation region and formation is minimized along the side surfaces of the isolation region.

A still further object of the invention is to provide a method for manufacturing a semiconductor integrated circuit which exhibits only a small parasitic MOS effect of the isolation region.

The above objects can be achieved, according to the invention, by a method which is characterized by the steps of forming an oxidation-inhibiting film on at least one surface of a semiconductor substrate of one conductivity type, removing a selected area of the oxidation-inhibiting film and the semiconductor substrate in a portion thereof beneath the selected area to a given depth thereby forming a recess in the semiconductor substrate, forming a thin layer of a semiconductive material capable of being oxidized into a corresponding oxide on each of the side surfaces of the recess, and subjecting the thin layer to oxidation for converting all or part of said semiconductive material into the corresponding growing oxide until the recess is completely filled up with the oxide.

In a more specific aspect, the semiconductor substrate is formed with a groove or recess in which a dielectric isolation region is to be formed, and then a polycrystalline semiconductive material or amorphous semiconductive material such as silicon is formed as a layer on the side surfaces or on all the exposed surfaces including the side surfaces and the bottom surface of the recess. Thereafter, heat is applied in an oxidative atmosphere to convert part or all of the polycrystalline or amorphous semiconductive material into the oxide until the recess is fully filled with the oxide.

This technique of forming the dielectric isolation region is particularly effective in producing not only MOSLSI circuits but also bipolar LSI circuits.

These and other objects and advantages of the present invention will be fully appreciated from the following description and the accompanying drawings.

BRIEF DESCRIPTION OF THE INVENTION

In the Drawings,

FIG. 1(a) through 1(d) are sectional views of a semiconductor device manufactured in accordance with a process of the prior art;

FIGS. 2(a) through 2(g) show a manufacturing process for a semiconductor device according to the first embodiment of the present invention;

FIG. 3 is a sectional view of the dielectric isolation region of FIG. 2(d) in which the Si film is entirely replaced by a SiO$_2$ film;

FIGS. 4(a) and 4(b) are sectional views illustrating a second embodiment according to the invention;

FIG. 5 is a sectional view illustrating the case where a large area is dielectrically isolated;

FIGS. 6(a) through 6(d) are sectional views illustrating a third embodiment according to the invention;

Figure 1A:
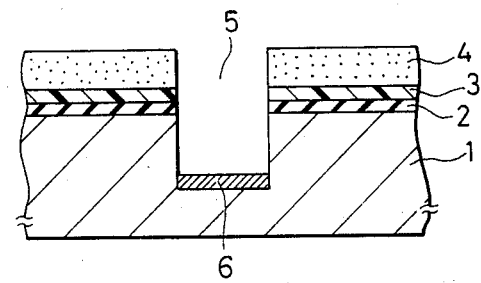
Figure 1B:
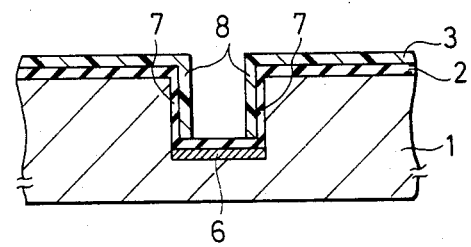
Figure 1C:
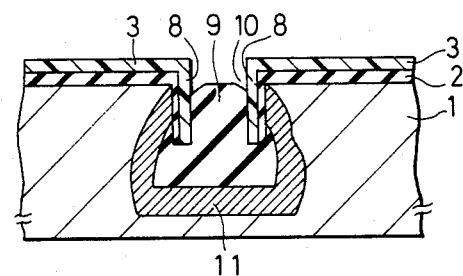
Figure 1D:
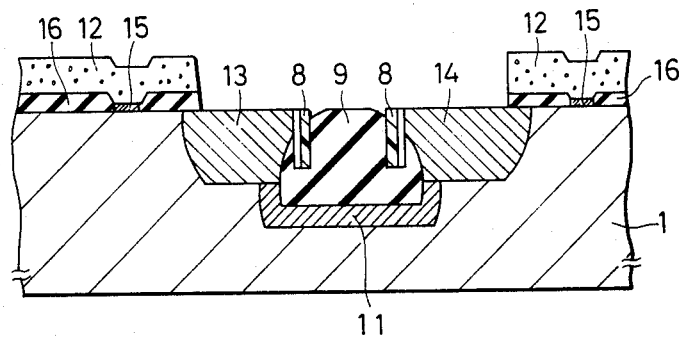

Referring now to FIGS. 2 through 9 for a complete description of the present invention wherein like reference numerals identify like parts, FIGS. 2(a) through 2(g) illustrate the manufacturing process of a MOSLSI circuit according to one embodiment of the invention.

Figure 2A:
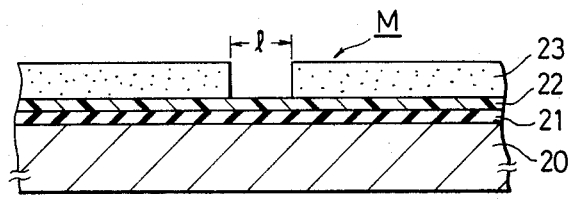

In FIGS. 2(a) through 2(g), there is shown part of a MOSLSI circuit M, which includes, for example, a p-type silicon semiconductor substrate 20 forming thereon a 0.05 micron thick SiO$_2$ film 21 and an about 0.1 micron thick Si$_3$N$_4$ film 22 as shown in FIG. 2(a). Then, a photoresist film 23 is formed on regions other than a dielectric isolation region by the photo-lithographic technique so that the resulting groove has a width, l, of say, 2 microns.

Then, sputter etching is effected through the mask of the photoresist film 23. For instance, C$_4$F$_8$ gas is introduced into the sputtering system and the plasma sputter etching is conducted under usual conditions, for example, of about 0.07 Torr. and 200 W. By this, the Si$_3$N$_4$ film 22 and the SiO$_2$ film 21 in the region free of any photoresist film are removed. Moreover, the plasma sputter etching is further carried out under ordinary conditions of about 0.05 Torr. and 300 W while introducing CF$_4$, CCl$_4$, CF$_2$Cl$_2$ or the like gas until the exposed Si substrate 20 is etched to a depth of about 1.5 microns thereby forming a groove or recess 24 in which an angle of the side wall with respect to the exposed Si surface is 90°. This is particularly shown in FIG. 2(b).

Then, the recess 24 is further etched at the bottom and side surfaces thereof with a mixed solution of HNO$_3$ and HF to a depth of about 0.1 micron as usual, so that the crystal strains and the polluted regions ordinarily produced upon the plasma sputter etching are eliminated. After this, impurity ions are injected to the bottom of the recess 24, e.g. boron of 60 KeV and about $3 \times 10^{13}$ ions/cm$^2$ is injected into the bottom to form an ion-injected region 25 as particularly shown in FIG. 2(c).

Figure 2B:
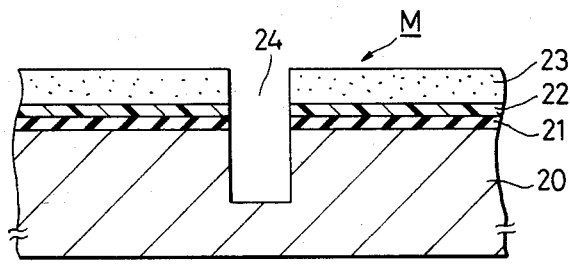

The photoresist film 23 is subsequently removed and an insulating oxide film 26 such as an about 0.1 micron thick SiO$_2$ film is formed on the exposed surfaces of the recess 24 by heat oxidation, followed by forming a thin film 27 of a semiconductive material capable of being converted to a corresponding dielectric oxide over an entire surface of the element including the recess surface by the CVD method, vacuum evaporation method or sputtering method. This thin film is, for example, made of polycrystalline Si in a thickness of about 0.5 micron as shown in FIG. 2(d).

Figure 2C:
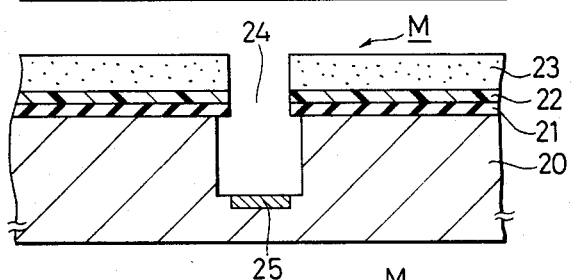
Figure 2D:
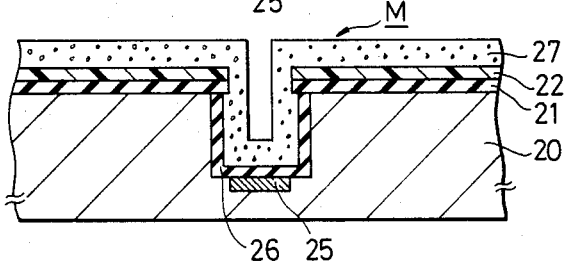
Figure 2E:
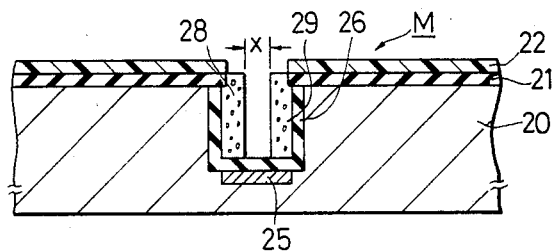
Figure 2F:
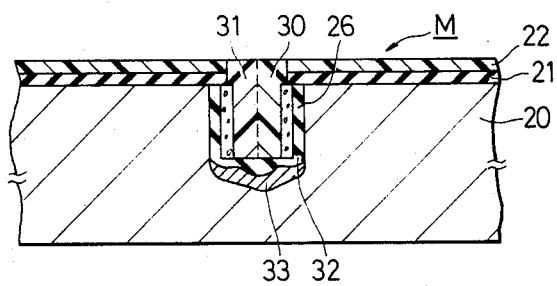

Next, the thin film 27 is removed by sputter etching or ion milling techniques in such a way that the thin film remains only on the side surfaces of the recess 24 as 28, 29 in FIG. 2(e).

The remaining films are then oxidized in pressurized steam. As a result, the oxide grows from the opposite sides of the recess. In the case, when, for example, the polycrystalline Si films 28, 29 are oxidized, the resulting oxide has a thickness about two times as great as the thickness of the consumed or oxidized Si. If the distance, x, between the thin films 28 and 29 as shown in FIG. 2(e) is 0.5 micron, the Si thin films 28 and 29 are, respectively, oxidized to form 0.5 microns thick SiO$_2$ layers. In this case, each of the 0.5 micron thick Si thin films 27, 28 takes part in the oxidation reaction in a thickness of 0.25 micron with an increase in thickness of 0.25 micron thereby forming SiO$_2$ films 30, 31. By this, the recess 24 is filled up with the non-oxidized, remaining Si thin films 28, 29 and the SiO$_2$ films 30, 31. At the same time, the Si substrate is also partly oxidized into an about 0.2 micron thick SiO$_2$ film 32 and the impurity ion-injected region 25 serves as a diffusion source to form a p$^+$-type channel stopper region 33. This oxidation is usually effected using a pressurized steam of 900°–1000° C. and 6–10 kg/cm$^2$ for a certain time, by which the formation of the SiO$_2$ films and the channel stopper region is ensured.

In order to form a dielectric isolation region with a depth of 1.5 microns by known techniques, a 1.5 microns thick SiO$_2$ film has to be formed. However, according to the procedure of the invention illustrated above, the formation of a 0.5 micron thick silicon film leads to the formation of a dielectric isolation region with a depth of 1.5 microns. Accordingly, the oxidation time can be reduced to about 1/10 time that of the conventional technique. Because of this reduced oxidation time, little or no thin Si$_3$N$_4$ film is formed beneath the SiO$_2$ layer 21 as will be experienced in the prior art technique.

Figure 2G:
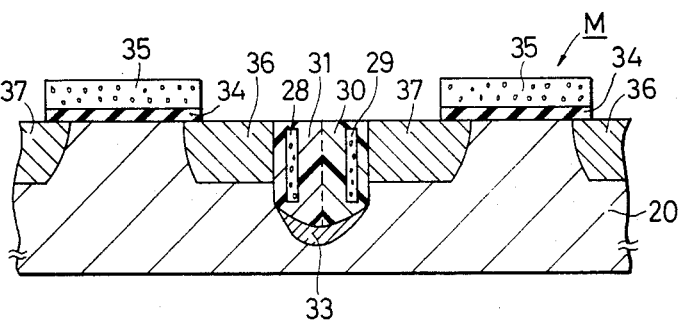

Finally, the Si$_3$N$_4$ film 22 and SiO$_2$ film 21 are completely removed, after which a gate oxide film 34, a polycrystalline Si gate electrode 35 and n$^+$-type source-drain regions 36, 37 are formed as usual to obtain a chip of the MOSLSI device as shown in FIG. 2(g). In this case, because no thin Si$_3$N$_4$ film is formed beneath the SiO$_2$ film 21 upon formation of the SiO$_2$ films 30, 31, the pinhole density of the gate oxide film is reduced thereby obtaining the LSI circuit in high yield.

Figure 3:
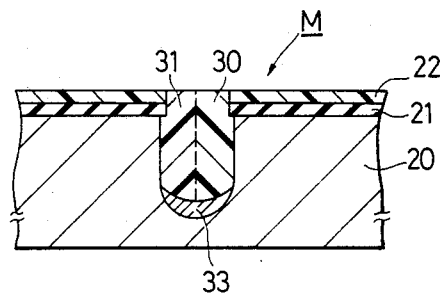

In the above process, the thin Si films 28, 29 are partially oxidized into SiO$_2$, but all the Si films may be converted into SiO$_2$ under properly controlled conditions. For instance, the step of forming the SiO$_2$ film 26 as shown in FIG. 2(d) is omitted. When the width of the recess is determined, for example, as 1 micron and the thickness of each of the thin Si films 28, 29 are determined as 0.25 micron, the distance between the thin Si films 28, 29 is 0.5 micron. When the thin Si films having a total thickness of 0.5 micron are oxidized, the thin Si films 28, 29 are all oxidized into SiO$_2$ 30, 31 to fill the recess 24 therewith as shown in FIG. 3. That is, when the thin films are formed in a total thickness corresponding to the half of the recess width, all the films can be converted to oxide.

Figure 4A:
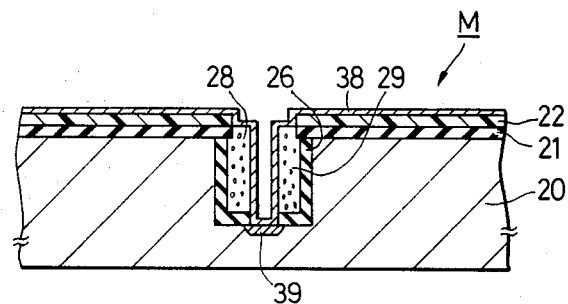
Figure 4B:
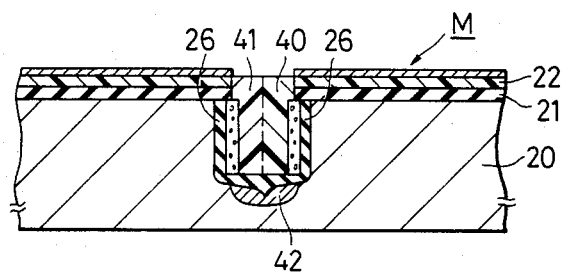

In accordance with the second embodiment of the invention, after leaving the thin Si films 28, 29 only along the side surfaces or walls of the recess 24 in the step of FIG. 2(e) without injecting impurity ions in the step of FIG. 2(c) in the first embodiment, the exposed SiO$_2$ film 26 is removed as shown in FIG. 4(a) and then a SiO$_2$ film 38 containing an impurity such as boron (BSG) is formed over the entire surface of the chip, followed by thermal treatment to form a p$^+$-type region 39 at the bottom of the recess 24. Upon heating in an oxidative atmosphere, the recess 24 is filled with SiO$_2$ films 40, 41 as shown in FIG. 4(b). In this case, because of the diffusion from the exposed portion of the Si substrate at the bottom of the recess 24, the p$^+$-type channel stopper 42 does not extend in the transverse direction so much.

Figure 5:
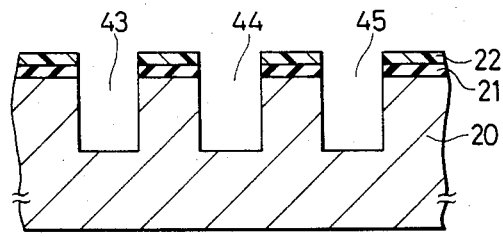

If a wide dielectric isolation region is desired, a plurality of recesses 43, 44 and 45 as shown in FIG. 5 are formed, each of which has the same width as the recess of FIG. 2, followed by repeating the procedure of FIGS. 2(a) through 2(g).

In the foregoing description, the thin film 27 is made of polycrystalline Si but instead of the polycrystalline Si, there may be used amorphous Si. A mixed gas of SiH$_4$ and H$_2$, Ar or F$_2$ is charged into the manufacturing system and subjected to plasma deposition to form amorphous Si containing H, Ar and/or F atoms as the film 27. When, for example, plasma deposition is conducted under conditions of a substrate temperature of 125° C. at the time of the growth, a SiH$_4$/SiH$_4$+H$_2$ rate of 20% and an electric power of 0.2 W/cm$^2$, amorphous Si containing 30–40% of hydrogen atoms is formed. In order to increase the concentration of hydrogen atoms in the Si film, it will suffice to increase the concentration of H$_2$ in the mixed gas or to lower the substrate temperature on growing or increase the power.

This amorphous thin Si film has the advantage that its oxidation speed is more rapid than that of the polycrystalline thin Si film and that when oxidized, the Si is converted into SiO$_2$ having a thickness of about 1.6 times that of the consumed Si. When the distance, x, between the thin Si films 28 and 29 of FIG. 2(e) is 0.5 micron and a 0.7 micron thick SiO$_2$ is formed, an about 0.44 micron thick amorphous Si layer is consumed to fill the recess 24 with the SiO$_2$ film. Accordingly, in the procedure of the second embodiment, if it is needed to make a small distance between the thin Si films 28 and 29 and a small width of the channel stopper region 42, use of amorphous Si is more advantageous since the oxidation speed is more rapid and a thick SiO$_2$ film can be formed even though the distance between the thin Si films 28 and 29 is small. Moreover, an increasing concentration of hydrogen atoms contained in the amorphous Si film results in an increasing speed of oxidation and a decreasing ratio of the thickness of consumed Si to the thickness of formed SiO$_2$. Smaller ratios result in a smaller degree of growth of SiO$_2$ mass from the thin Si films 28, 29 making the surface of the dielectric isolation region more flat, coupled with another advantage that, because of the small strain established between the SiO$_2$ films and the Si substrate, little or no occurrence of crystal defects is involved upon formation of the SiO$_2$ films 30, 31. In general, the concentration of hydrogen atoms or other atoms to be contained in amorphous Si is in the range of 10 to 40%, preferably 30 to 40% of the amorphous silicon.

According to the present invention, the thickness of the dielectric isolation layer depends on the depth of the recess 24. The thickness of the oxide film mainly depends on the distance between the thin films 28 and 29. Accordingly, a deep recess 24 and a small distance between the thin films allow a short time of oxidation even though the dielectric isolation layer is deep. By this, the impurity for the channel stopper 33 or 42 is diffused only to a slight extent with a limited extension toward the transverse direction.

This is advantageous in that the p$^+$-type channel stopper 33 does not contact the n$^+$-type source-drain regions 36, 37, causing the reverse voltage between the substrate and the drain region not to be lowered with the p-n junction capacitance being small. Furthermore, as described hereinbefore, the short time of oxidation for the formation of the dielectric isolation layer is sufficient and thus no Si$_3$N$_4$ film is freshly formed on the surface of the Si substrate beneath the SiO$_2$ layer, with the result that the pinhole density of the gate oxide film 33 is small. The dielectric insulation layer is formed by oxidation of the Si thin films 28, 29. With the substrate 20 being only slightly oxidized, no strain in the substrate is produced without involving any stacking fault. This leads to a small leakage current of the p-n junction between the substrate 20 and the source-drain regions 36, 37. Thus, LSI circuits can be obtained in high yields.

Additionally, since the oxidation is effected on the thin Si films 28, 29 formed along the side surfaces of the recess, the isolation region becomes flat and thus fine patterns can also be formed in high yield. The area of the SiO$_2$ isolation region is not larger than the width of the recess 24 and thus the areas for forming passive and active elements are not reduced, so that the characteristics of a desired LSI device are prevented from deteriorating.

The third embodiment for the manufacture of a MOSLSI device is described with reference to FIGS. 6(a) through 6(e).

The steps of FIGS. 2(a) through 2(d) of the first embodiment are repeated, by which the polycrystalline or amorphous Si thin film 27 is formed.

Figure 6A:
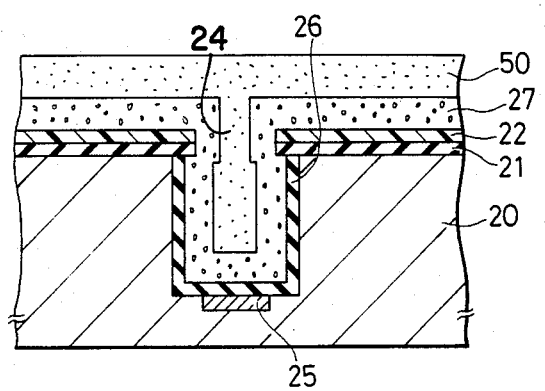

Then, an organic resin (e.g. available under the trade name of AZ 1350) is applied to the substrate by a rotary application technique to form a resin film 50 on the substrate in a predetermined thickness, say, about 0.8 microns in such a way that the recess 24 is completely filled with the resin as shown in FIG. 6(a). The organic resins used for this purpose are those which are usually employed as the photoresist and include, for example, novolac resins, polyamides and the like.

Figure 6B:
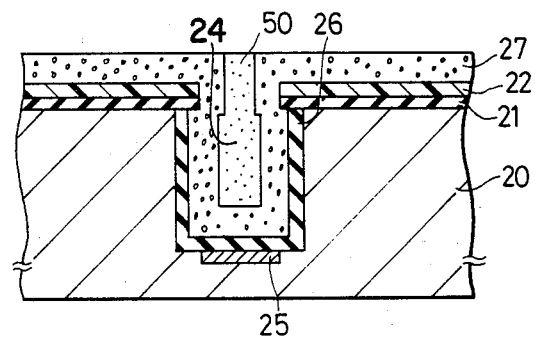

Then, the 0.8 micron thick coating film 50 is removed by etching in O$_2$ gas plasma so that the resin remains only in the recess 24. This is shown in FIG. 6(b).

Figure 6C:
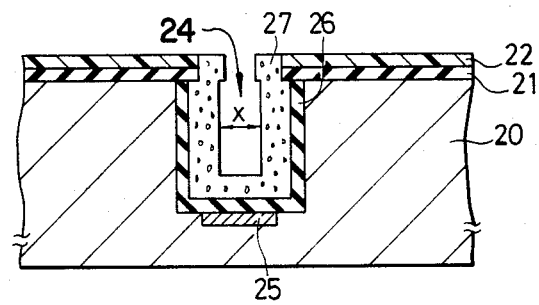
Figure 6D:
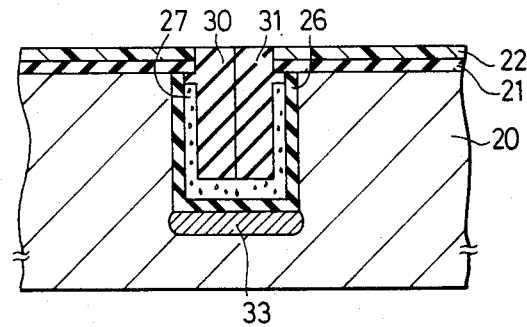

Next, the exposed Si thin film 27 is eliminated by CF$_4$ plasma while leaving the thin Si film 27 around the recess 24, followed by removing the resin 50 filled in the recess 24 as shown in FIG. 6(c).

The thus treated thin Si film is oxidized in pressurized steam of 900°–1000° C. and 6–10 kg/cm$^2$ similar to the first embodiment to form SiO$_2$ films 30, 31 with which the recess is filled. Simultaneously, a p$^+$-type channel stopper region 33 is formed from the diffusion source of the boron ion-injected region 25.

After removal of the Si$_3$N$_4$ film 22 and SiO$_2$ film 21, the gate oxide film 34, the polycrystalline Si gate electrode 35 and the n$^+$-type source-drain regions 36, 37 are similarly formed.

Figure 7:
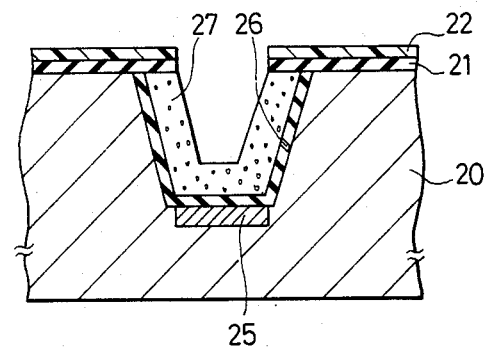
FIG. 7 is a sectional view showing a dielectric insulation region in which the side walls or surfaces of the recess are not arranged perpendicularly to the exposed substrate surface.

In the above process, the recess is so formed that the angle between the substrate surface and the side surface of the recess is 90°. In this connection, however, as is shown in FIG. 7, even though the angle is not 90°, the polycrystalline Si film in portions other than the recess can be eliminated after filling-up of the recess with an organic resin, making it possible to leave the thin polycrystalline Si layer on the surfaces of the recess including the side and bottom surfaces. Accordingly, the embodiment shown in FIGS. 6(a) through 6(d) ensures substantially complete filling-up of the recess 24 with the SiO$_2$ film even if the recess has a slightly varying shape. This means that this embodiment allows a wide tolerance of Si substrate-etching conditions for forming the recess 24, so that the manufacture of the devices becomes easier.

Figure 8:
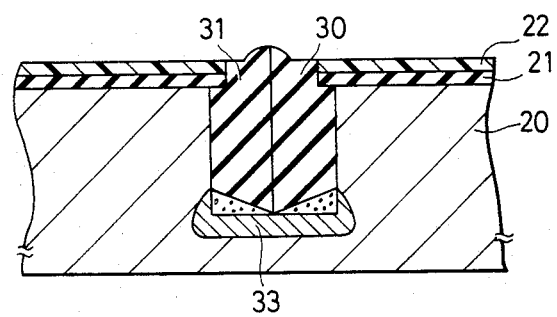
FIG. 8 is a sectional view illustrating a fourth embodiment according to the invention.
Figure 9:
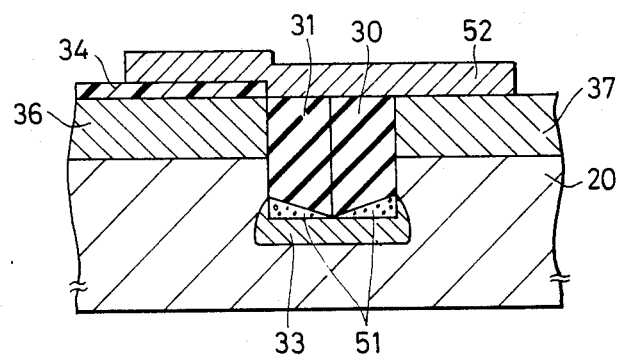
FIG. 9 is a sectional view showing a part of the MOSLSI device fabricated according to the fourth embodiment of the invention.

The fourth embodiment of the invention is shown in FIGS. 8 and 9 in which the thin polycrystalline Si films formed along the side surfaces of the recess 24 are all converted to SiO$_2$ but the thin film formed at the bottom of the recess is allowed to remain unchanged, by which the recess is filled with SiO$_2$. In this embodiment, the steps of FIGS. 2(a) through 2(c) are first effected. After formation of a thin polycrystalline Si film with a predetermined thickness corresponding to ¼ of the recess width, for example, 0.25 micron, when the recess width is 1 micron, the steps of FIGS. 6(a) through 6(c) are repeated to leave the thin polycrystalline Si film 27 on the entire surface of the recess 24. The remaining Si film is then oxidized as shown in FIG. 8, whereby all the polycrystalline thin film 27 formed on the opposite sides of the recess 24 is converted to SiO$_2$ films 30, 31 with which the recess is filled up. In this case, when the polycrystalline silicon 27 is oxidized, the SiO$_2$ film formed by the oxidation of the polycrystalline silicon at the opposite sides covers the silicon at the bottom of the recess 24 therewith, so that the oxidation of the silicon at the bottom surface proceeds more slowly.

Thus, the thin polycrystalline Si film 27 which has not been converted to SiO$_2$ is left at the bottom of the recess 24, forming a p$^+$-type polycrystalline silicon film 51 for which the ion-injected region 25 serves as the diffusion source. When a MOSLSI device is manufactured according to the procedure of the fourth embodiment, a drain region 37, a source region 36, a SiO$_2$ film 34 and an aluminum wiring 52 are formed as shown in FIG. 9.

In this arrangement, when a positive voltage with respect to the substrate 20 is applied to the aluminum wiring 52, electrons are induced around the SiO$_2$ film 34, which is converted into an n-type semiconductor when the voltage increases, whereupon an electric current passes between the drain region 37 and the source region 36. The voltage of the Al wiring at this time is designated as $V_{TF}$.

Even though the portion around the SiO$_2$ film 34 is converted into the n-type semiconductor, the mobility of electrons in the p$^+$-type polycrystalline Si film is so low that the current passing between the drain region 37 and the source region 36 is small. This permits the voltage of the Al wiring to be increased, that is, $V_{TF}$ of the parasitic MOS transistor can be made high.

In the first to fourth embodiments, polycrystalline Si or amorphous Si is used but other materials capable of being converted into oxides by oxidation may be used including, for example, Al, Ti, and the like. Moreover, the MOSLSI devices have been described for convenience and the procedures of these embodiments can likewise be applied to the manufacture of bipolar LSI devices using, for example, GaAs, InP or the like semiconductors.

As will be understood from the foregoing, the present invention has a number of advantages.

(1) There can be provided a dielectric isolation region which has a narrow width and reduced irregularities, greatly contributing to the manufacture of highly dense semiconductor devices.

(2) The diffusion of impurities for a channel stopper is reduced because the depth of the isolation region depends on the depth of the recess and a deep isolation region can be formed utilizing thin oxide films.

(3) The recess is filled up with oxides of polycrystalline or amorphous Si growing from opposite sides of the recess, so that no strains are produced in the substrate, and because of reduced leakage current between p-n junctions, LSI devices are obtained in high yield.

(4) It is not necessary to fill the entirety of the recess with an oxide-forming semiconductive material such as polycrystalline Si, and thus this material can be as a thin film, facilitating the thin film to be left on the surfaces alone of the recess.

(5) With the case of the third and fourth embodiments, the recess is not required to be so shaped that the angle between the substrate and the side surface of the recess is 90°, LSI devices being manufactured relatively easily in high yield.

(6) Especially in the case of the fourth embodiment, the p$^+$-type thin polycrystalline silicon film 51 is formed beneath the isolation SiO$_2$ film, enabling $V_{TF}$ of the parasitic MOS transistor to be increased.

What is claimed is:

1. In a method for the formation of isolation oxide regions in a semiconductor substrate, the improvement comprising:
   (a) forming an oxidation-inhibiting film on one surface of a semiconductor substrate of one conductivity type;
   (b) removing selected areas of said oxidation-inhibiting film through an etching mask in said semiconductor substrate in portions beneath the selected areas to a given depth, thereby forming recesses in said semiconductor substrate;
   (c) forming a thin layer of a semiconductor material capable of being oxidized into a corresponding growing oxide over the one surface of the semiconductor substrate;
   (d) removing the thin layer of the semiconductive material from the semiconductor substrate while leaving thin layers of the semiconductive material only on side surfaces of each recess so that a central portion of the bottom of each recess is exposed; and
   (e) subjecting the thin layers to oxidation for converting the semiconductive material into the corresponding oxide until the recesses are each completely filled with the oxide whereby dielectric isolation regions are formed in the respective recesses.

2. The method according to claim 1, wherein the angle between the substrate and each side surface of each recess is substantially 90°.

3. The method according to claim 1, wherein said semiconductor substrate is made of silicon and after the step (b), the bottom and side surfaces of each recess are etched with a mixed solution of $HNO_3$ and HF.

4. The method according to claim 1 or 3, wherein impurity ions of one conductivity type are injected into the bottom of the recess.

5. The method according to claim 4, wherein the impurity ions are boron ions.

6. The method according to claim 1, wherein said semiconductive material is polycrystalline silicon or amorphous silicon.

7. The method according to claim 1, wherein the oxidation is effected in pressurized steam of 900°–1000° C. and 6–10 kg/cm$^2$ for a time sufficient to fill the recesses with the growing oxide.

8. The method according to claim 1, wherein said thin layers are partly oxidized into the corresponding oxide until each recess is filled therewith.

9. The method according to claim 1, wherein said thin layers are entirely oxidized into the corresponding oxide.

10. The method according to claim 1, wherein said substrate is made of silicon, and said thin layers are made of polycrystalline silicon.

11. The method according to claim 1, wherein after the step (d), the exposed thin layer is removed from each recess until the semiconductor substrate is exposed, and a silicate glass film containing a boron impurity is deposited on at least surfaces of each recess and thermally treated to diffuse said impurity into the bottom of said recess.

12. The method according to claim 1, wherein a plurality of recesses each having the same width as the recesses in step (b) are formed at predetermined intervals.

13. The method according to claim 1, wherein said semiconductive material is amorphous silicon.

14. The method according to claim 1, wherein the thin layers are formed on side surfaces of each recess after formation of an insulating film.

15. A method for the formation of isolation oxide regions in a semiconductor substrate, the method comprising:
 (a) forming an oxidation-inhibiting film on one surface of a semiconductor substrate of one conductivity type;
 (b) removing selected areas of said oxidation-inhibiting film through an etching mask in said semiconductor substrate in portions beneath the selected areas to a given depth, thereby forming recesses in said semiconductor substrate;
 (c) injecting impurity ions of one conductivity type into the bottom of the semiconductor substrate;
 (d) forming thin layers of a semiconductive material capable of being oxidized into a corresponding growing oxide on the side and bottom surfaces of the recesses;
 (e) applying an etching-inhibiting material to the substrate so that the recesses are filled with the etching-inhibiting material;
 (f) removing the etching-inhibiting material from the substrate but leaving the etching-inhibiting material in each recess of the substrate;
 (g) removing the exposed thin layers of semiconductive material whereby the thin layers which are protected by the material in the recesses remain;
 (h) removing the etching-inhibiting material from each recess; and
 (i) subjecting the thin layers to oxidation for converting the semiconductive material into the corresponding oxide until the recesses are each completely filled with the oxide whereby dielectric isolation regions are formed in the respective recesses.

16. The method according to claim 15, wherein the angle between the substrate surface and the side surface of each recess is higher than 90°.

17. The method according to claim 15, wherein the thin layers are formed in a thickness of ¼ that of the width of each recess whereby the thin layers are oxidized in the step (i) to fill the recesses therewith while leaving a non-oxidized layer at the bottom of each recess.

18. The method according to claim 15, wherein said etching-inhibiting material is an organic resin.

* * * * *